(12) United States Patent
Pekola et al.

(10) Patent No.: US 8,587,325 B2
(45) Date of Patent: Nov. 19, 2013

(54) METHOD AND APPARATUS FOR MEASURING BEARING CURRENTS IN AN ELECTRICAL MACHINE

(75) Inventors: Jari Pekola, Vantaa (FI); Tapio Haring, Kuopio (FI); Petri Mäki-Ontto, Espoo (FI)

(73) Assignee: ABB Oy, Helsinki (FI)

( * ) Notice: Subject to any disclaimer, the term of this patent is extended or adjusted under 35 U.S.C. 154(b) by 322 days.

(21) Appl. No.: 13/008,595

(22) Filed: Jan. 18, 2011

(65) Prior Publication Data
US 2011/0169504 A1 Jul. 14, 2011

Related U.S. Application Data

(63) Continuation of application No. PCT/FI2009/000065, filed on Jul. 15, 2009.

(30) Foreign Application Priority Data

Jul. 15, 2008 (FI) ........................................ 20080438

(51) Int. Cl.
*G01R 27/04* (2006.01)
(52) U.S. Cl.
USPC ............................................. 324/629; 324/536
(58) Field of Classification Search
USPC ................................................. 324/536, 629
See application file for complete search history.

(56) References Cited

U.S. PATENT DOCUMENTS

| 4,238,733 | A | | 12/1980 | Freeman |
| 5,208,542 | A | | 5/1993 | Tennies et al. |
| 5,729,145 | A | * | 3/1998 | Blades ........................... 324/536 |
| 2009/0302864 | A1 | | 12/2009 | Marinov |

FOREIGN PATENT DOCUMENTS

| DE | 3821241 A1 | 2/1989 |
| EP | 0510795 A2 | 10/1992 |
| EP | 1406365 A1 | 4/2004 |
| WO | WO 2007/106015 A1 | 9/2007 |

OTHER PUBLICATIONS

International Search Report (PCT/ISA/210) issued on Nov. 18, 2009, by European Patent Office as the International Searching Authority for International Application No. PCT/FI2009/000065.
Written Opinion (PCT/ISA/237) issued on Nov. 18, 2009, by European Patent Office as the International Searching Authority for International Application No. PCT/FI2009/000065.

* cited by examiner

*Primary Examiner* — Vincent Q Nguyen
(74) *Attorney, Agent, or Firm* — Buchanan Ingersoll & Rooney PC

(57) ABSTRACT

The present disclosure relates to a measuring bearing currents in an electrical machine. According to exemplary embodiments, radio frequency signals that are generated by electric discharges are detected by an antenna near the bearing. A synchronizing signal is combined with the origin of the bearing current and signal triggered by the synchronizing signal is measured.

19 Claims, 2 Drawing Sheets

Legend:
18 – Oscilloscope
24 – Analyzer
26 – Registration Module
28 – Memory

METHOD AND APPARATUS FOR MEASURING BEARING CURRENTS IN AN ELECTRICAL MACHINE

RELATED APPLICATIONS

This application claims priority as a continuation application under 35 U.S.C. §120 to PCT/FI2009/000065 filed, which was filed as an International Application on Jul. 15, 2009 designating the U.S., and which claims priority to Finnish Application 20080438 filed in Europe on Jul. 15, 2008. The entire contents of these applications are hereby incorporated by reference in their entireties.

FIELD

The present disclosure relates to a method and apparatus for measuring bearing currents in an electrical machine by, for example, detecting radio frequency (RF) signals that are generated by the electric discharges in the bearings of the machine.

BACKGROUND INFORMATION

Electrical discharges occur in the electrical machines for many reasons. The electrical discharges are harmful and they tend to damage the machine in different ways. Three main causes are partial discharges of the windings, the bearing currents and sparking of the commutator. All these phenomena have been thoroughly investigated and there have been many proposals how to prevent and/or how to detect them before the efficiency of the electrical machine has been deteriorated or before any part of the machine has been damaged totally.

There have been many approaches to utilize the RF signal detection when defining the appearance of the electric discharges. The RF signal detectors have been proposed for detecting the electric discharges that are caused (e.g., by the loose or broken conductors in the windings, intermittent strand and turn shorts in the windings). Further, there have been several proposals to monitor brush arcing in the commutator of the DC machine.

The electric discharges and the RF signals are in direct connection with the windings and the commutators, respectively, where the discharges can originate. For example, the electric discharge and the RF signals can be generated in commutator because of the wearing and ageing of the brushes.

With the bearing currents, the situation is more difficult. The bearing currents can not be measured in many cases, but other variables, like common mode current or voltage in the terminals of the motor, or the voltage over the bearing may be measured. In some cases even these variables are inaccessible. Further, it is not certain whether harmful discharges occur in the bearings.

Published International Application WO 2007/106015, the disclosure of which is hereby incorporated by reference in its entirety, discloses a method for indicating an electric discharge in a bearing of an electric drive system. The detected RF signals are processed to estimate the electric discharge and the estimated electric discharge is indicated. While known solutions use the RF signals when detecting electric discharges of the electrical machine, they suffer drawbacks with regard to identifying when the detected RF signal truly is connected to the electric discharge in question.

SUMMARY

A method for measuring a bearing current in an electrical machine is disclosed, wherein electric discharges are generated, the electrical machine including a stator fixed to a frame of the electrical machine, and a rotor that is arranged to rotate around its axis and that is supported to the frame by bearings, where an electric discharge burst occurs when a voltage over a lubricating film is high and the electric discharge generates a radio frequency signal, whereby radio frequency signals are received by an antenna near a location of the electric discharge, the method comprising: generating a synchronizing signal dependent in time on an origin of the electric discharge; triggering a radio frequency signal detecting equipment in response to the synchronizing signal; and registering a radio frequency signal that matches to the synchronizing signal as a signal representing the bearing current.

An apparatus is disclosed for measuring bearing currents by monitoring an electric discharge generated in an electrical machine that includes a stator fixed to a frame of the electrical machine, and a rotor that is arranged to rotate around its axis and that is supported to the frame by bearings, whereby an electric discharge bursts over the bearing when a voltage over a lubricant film is too high and the electric discharge generates a radio frequency signal, the apparatus comprising: an antenna for placement near a location of electric discharge for receiving the radio frequency signal; a device for generating a synchronizing signal that is dependent in time on an origin of the electric discharge; a detector device that is triggered based on the synchronizing signal; and a registration component for displaying or storing a radio frequency signal that matches to the synchronizing signal.

BRIEF DESCRIPTION OF THE DRAWINGS

Further features and advantages of the present disclosure will become apparent from the following detailed description, taken in combination with the appended drawings, in which.

DETAILED DESCRIPTION

A new method and apparatus are disclosed for measuring bearing currents in the electrical machines by detecting RF signals caused by the electric discharges. According to an exemplary aspect of the disclosure, the method comprises: a synchronizing signal is generated and being timely dependent to the origin of the discharge, a radio frequency signal detecting equipment is triggered as a response to the synchronizing signal, the radio frequency signals that match to the synchronizing signal are registered as signal representing the bearing current.

According to an exemplary aspect of the disclosure, an apparatus comprises a device for generating a synchronizing signal that is timely dependent on and based to the origin of the discharge, a detector device that is triggered on the basis of synchronizing signal, and a registration component that displays or stores the radio frequency signals that match to the synchronizing signals.

According to an exemplary aspect of the disclosure, a time-window to be monitored is defined on the basis of the frequency of the synchronizing signal.

According to an exemplary aspect of the disclosure, the synchronizing signal is generated by the signal triggering the power electronic component of the frequency converter that controls the machine.

According to another exemplary aspect of the disclosure, the synchronizing signal is generated on the basis of the sensor detecting the common mode current or the common mode voltage.

According to an exemplary aspect of the disclosure, the radio frequency signals are integrated or counted. This data is utilized to define a parameter proportional to the malfunction of the bearing.

According to an exemplary aspect of the disclosure, the detector device includes (e.g., consists of) an oscilloscope, which displays a voltage proportional to the bearing current.

Exemplary embodiments of the present disclosure can provide a reliable and exact data if the high frequency voltages that originate from the power electronic switches cause the sparking. This data is possible to analyze and monitor accurately. Thus, the phenomena and its progress during the life cycle of the machine can easily be observed and utilized when evaluating the condition and possible maintenance requirement of the machine.

Figure 1:
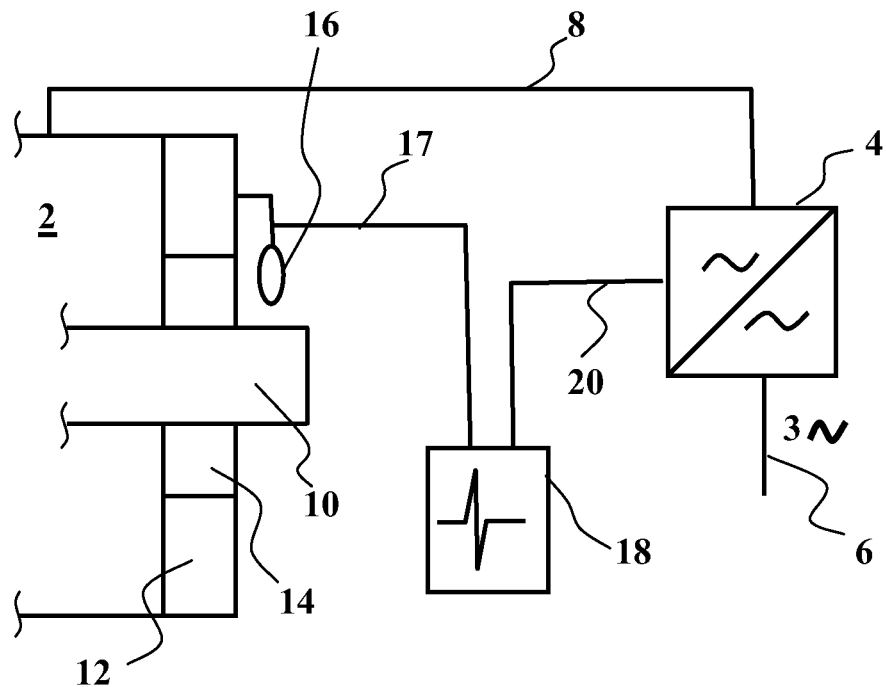
FIG. 1 schematically illustrates an exemplary embodiment of the disclosure.

FIG. 1 schematically illustrates an exemplary embodiment of the disclosure. An electrical AC motor 2 is driven by frequency converter 4, which converts the AC main voltage supplied from the mains 6. The output of the frequency converter 4 is connected via the lines 8 to the terminals of the motor 2. The frequency converter 4 includes (e.g., consists of) several electronic switches that are controlled by high frequency PWM pulses as is known in the art.

The shaft 10 of the electric motor 2 is supported to the frame 12 of the motor by bearing 14. When the high frequency voltage pulses circulate in the stator of the motor they may under certain circumstances cause a high voltage pulse over the lubricant film of the bearing 14. If the voltage is high enough, a bearing current flows through the bearing 14 causing an electric discharge. This phenomenon generates a radio frequency (RF) signal that can be detected by an antenna 16, which is placed near the bearing. The voltage in the output 17 of the antenna 16 can be monitored on the display of an oscilloscope 18. The magnitude of the bearing current that is proportional to the electric discharges can be measured. To obtain a more exact measurement result, the trigger signals of the switches in the frequency converter 4 can be conducted to the oscilloscope 18 via lines 20.

Figure 2:
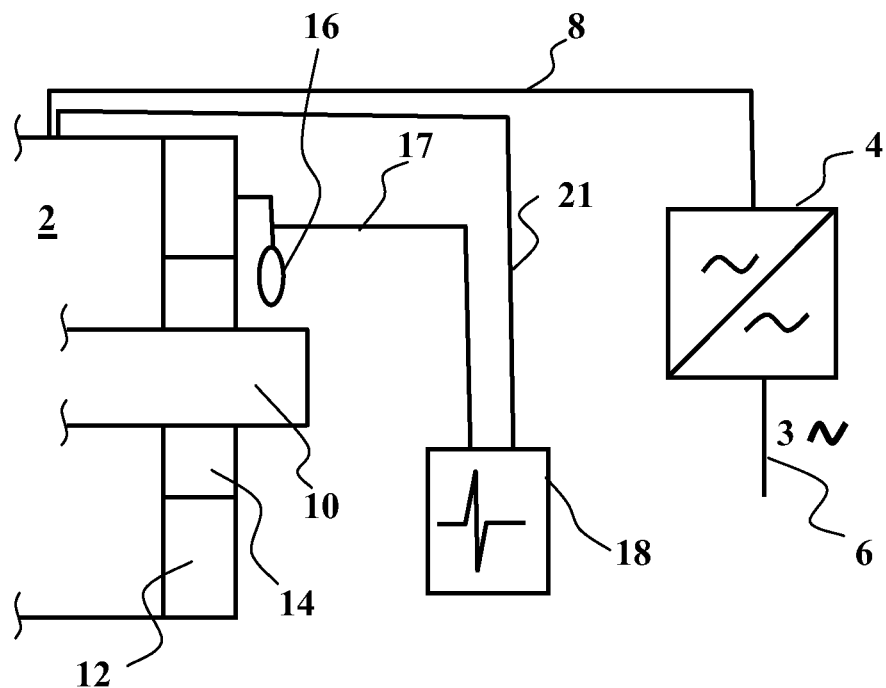
FIG. 2 schematically illustrates another exemplary embodiment of the disclosure.

FIG. 2 illustrates another exemplary embodiment of the disclosure. In the FIG. 2 embodiment, the trigger signals of the oscilloscope 18 is taken from the terminals of the electric machine 2 via the lines 21. The trigger signals are thereby generated from sensors that measure the common mode voltage or the common mode current.

The antenna 16 is a loop antenna with several loops receiving RF signals. Other kinds of antennas suitable for receiving RF signals can also be used. The choice of the antenna depends on the measuring distance. The synchronizing signal can be any signal that is connected to the origin of the creation of the bearing currents. Exemplary embodiments can provide an exact timing signal of the switching frequency, and this signal can be used as a synchronizing signal when detecting the RF signal by the antenna. The noise signals can be reliably eliminated.

Figure 3:
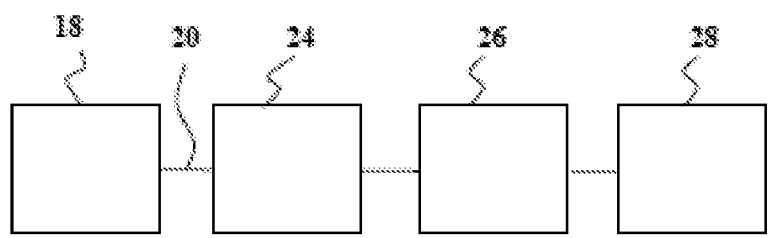
FIG. 3 schematically illustrates an embodiment of the disclosure in connection of diagnostic device.

FIG. 3 illustrates an exemplary diagnostic device that employs aspects disclosed herein. The output 20 of the oscilloscope 18 triggered by the synchronizing signal is conducted to the analyzer 24. The intensity and the recurrence of the sparking are detected and registered in the registration module 26. The results are stored in the memory 28 continuously. The data is used, for example, when defining the service and maintenance.

The results of the measurement can be further utilized by counting the discharge pulses by a pulse counter or integrator. This data can, for example, be advantageously used to define a parameter proportional to the malfunction of the bearing.

Exemplary embodiments of the disclosure as specifically described herein are intended to be exemplary only. The scope of the disclosure is therefore intended to be limited solely by the scope of the appended claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for measuring a bearing current in an electrical machine, wherein electric discharges are generated, the electrical machine including a stator fixed to a frame of the electrical machine, and a rotor that is arranged to rotate around its axis and that is supported to the frame by bearings, where an electric discharge burst occurs when a voltage over a lubricating film is high and the electric discharge generates a radio frequency signal, whereby radio frequency signals are received by an antenna near a location of the electric discharge, the method comprising:

generating a synchronizing signal dependent in time on an origin of the electric discharge based on a switching frequency received from a converter that controls the electric machine;

triggering a radio frequency signal detecting equipment in response to the synchronizing signal; and registering a radio frequency signal that matches to the synchronizing signal as a signal representing the bearing current.

2. Method according to the claim 1, comprising:

monitoring a time-window defined on a basis of a frequency of the synchronizing signal.

3. Method according to the claim 1, comprising:

integrating or counting plural radio frequency signals.

4. Method according to the claim 1, wherein the converter includes a plurality of electronic switches that are controlled by high frequency pulse width modulation (PWM) pulses.

5. Method according to claim 4, wherein the generating of the synchronizing signal comprises generating the synchronizing signal by conducting trigger signals of the switches in the converter.

6. Method according to claim 1, wherein the generating of the synchronizing signal comprises generating the synchronizing signal based on a sensor detecting a common mode current or common mode voltage.

7. An apparatus for measuring bearing currents by monitoring an electric discharge generated in an electrical machine that includes a stator fixed to a frame of the electrical machine, and a rotor that is arranged to rotate around its axis and that is supported to the frame by bearings, whereby an electric discharge bursts over the bearing when a voltage over a lubricant film is too high and the electric discharge generates a radio frequency signal, the apparatus comprising:

an antenna for placement near a location of electric discharge for receiving the radio frequency signal;

a device for generating a synchronizing signal that is dependent in time on an origin of the electric discharge;

a detector device that is triggered based on the synchronizing signal; and a registration component for displaying or storing a radio frequency signal that matches to the synchronizing signal, wherein the device for generating the synchronizing signal includes an input for receiving a switching frequency from a converter that controls the machine.

8. Apparatus according to the claim 7, comprising:

a sensor for detecting a common mode current or common mode voltage for generating the synchronizing signal.

9. Apparatus according to claim 8, comprising:

an oscilloscope for displaying a voltage proportional to bearing current.

10. Apparatus according to claim 8, comprising:

a pulse counter or integrator for defining a parameter proportional to a malfunction of the bearing.

11. Apparatus according to claim 7, comprising:

an oscilloscope for displaying a voltage proportional to bearing current.

12. Apparatus according to claim 11, comprising:

a pulse counter or integrator for defining a parameter proportional to a malfunction of the bearing.

13. Apparatus according to claim 7, comprising:

a pulse counter or integrator for defining a parameter proportional to a malfunction of the bearing.

14. Apparatus according to claim 7, comprising:

an oscilloscope for displaying a voltage proportional to bearing current.

15. Apparatus according to claim 7, comprising:

a pulse counter or integrator for defining a parameter proportional to a malfunction of the bearing.

16. Apparatus according to claim 7, in combination with an electric machine comprising:

a stator fixed to a frame of the electrical machine; and a rotor that is arranged to rotate around its axis and that is supported to the frame by bearings, whereby an electric discharge bursts over the bearing when a voltage over a lubricant film is too high and the electric discharge generates a radio frequency signal.

17. Apparatus according to the claim 7, wherein the converter includes a plurality of electronic switches that are controlled by high frequency pulse width modulation (PWM) pulses.

18. Apparatus according to claim 17, wherein the device for generating the synchronizing signal is configured to generate the synchronizing signal by conducting trigger signals of the switches in the converter.

19. Apparatus according to claim 7, wherein the device for generating the synchronizing signal is configured to generate the synchronizing signal based on a sensor detecting a common mode current or common mode voltage.

* * * * *